United States Patent [19]
De Niel et al.

[11] Patent Number: 5,656,127
[45] Date of Patent: Aug. 12, 1997

[54] DEVICE FOR INITIATING THE DELAMINATION OF AN IMAGE SUITED FOR DRY PROCESSING

[75] Inventors: Marc De Niel, Antwerpen; Martin De Kegelaer, Waasmunster, both of Belgium

[73] Assignee: Agfa-Gevaert, Mortsel, Belgium

[21] Appl. No.: 501,825

[22] Filed: Jul. 13, 1995

[30] Foreign Application Priority Data

Jul. 18, 1994 [BE] Belgium ............... 094000672

[51] Int. Cl.⁶ ........................... B32B 35/00
[52] U.S. Cl. ........................... 156/584; 156/344
[58] Field of Search ............... 156/344, 584; 271/280, 281, 285

[56] References Cited

U.S. PATENT DOCUMENTS

| | | | |
|---|---|---|---|
| 3,266,797 | 8/1966 | Stievenart | 156/584 X |
| 4,173,510 | 11/1979 | Tobey | 158/584 |
| 4,177,104 | 12/1979 | Parker | 156/584 |
| 5,141,584 | 8/1992 | Schuh et al. | 156/344 |
| 5,169,474 | 12/1992 | Binder | 156/344 |
| 5,169,475 | 12/1992 | Tobin | 156/344 |
| 5,282,918 | 2/1994 | Heist et al. | 156/344 |
| 5,478,428 | 12/1995 | Carpenter | 156/344 |
| 5,520,776 | 5/1996 | Van Allen et al. | 156/584 |
| 5,538,591 | 7/1996 | Collins et al. | 156/584 |
| 5,545,282 | 8/1996 | Bechmann | 156/344 |

*Primary Examiner*—Mark A. Osele
*Attorney, Agent, or Firm*—Brumbaugh, Graves, Donohue & Raymond

[57] ABSTRACT

Device for initiating the delamination of two sheets laminated together and arranged for forming a practicable image in one of the sheets, wherein the sheets are laminated with the leading edge of one sheet extending beyond the leading edge of the other sheet, and means are provided for positioning the laminate and clamping same in one particular position while leaving the leading edges of the laminate free, for bending off the free leading edges on a well-specified corner thereby initiating the delamination, for scraping one sheet from the other sheet, and for clamping the scraped-off sheet.

11 Claims, 4 Drawing Sheets

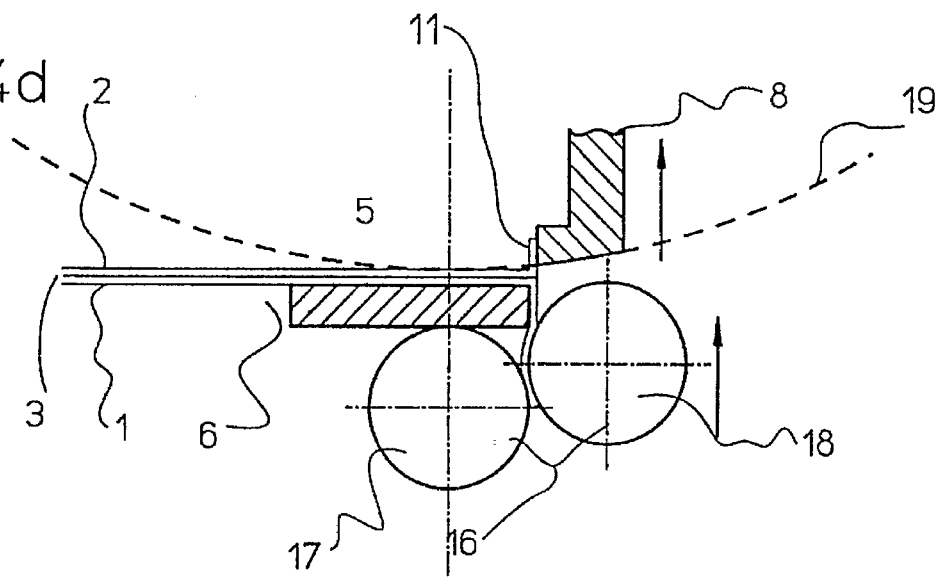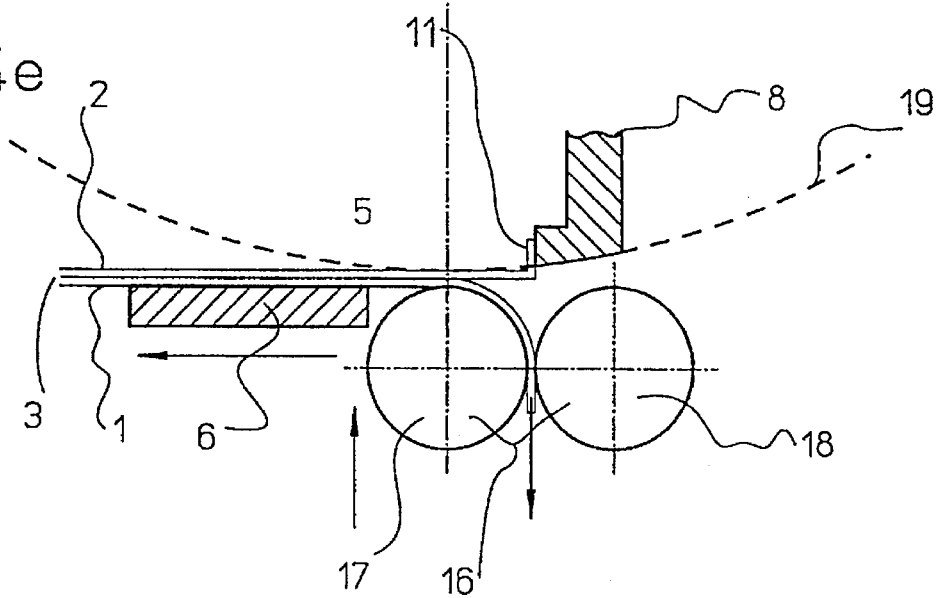

DEVICE FOR INITIATING THE DELAMINATION OF AN IMAGE SUITED FOR DRY PROCESSING

BACKGROUND OF THE INVENTION

1. Field of the Invention

The present invention relates to a device for producing an imaging element by peeling apart an image-receiving sheet from an image-bearing sheet laminated thereto subsequent to the exposure of said image-bearing sheet, for example, by means of laser radiation.

2. Description of the Prior Art

Several proposals have been disclosed so far for obtaining an imaging element suited for development by dry processing with the main purpose of avoiding the use of any processing liquids.

In addition to its substantial environmental advantages, dry processing, offers the considerable benefit of being suited for use under regular room illumination. However, these features are counterbalanced by the relatively low sensitivity and the high-power of the exposing equipment involved in dry processing.

The latent-image formation commonly occurs by introducing selective adhesion differences between the density-producing and the image-bearing layers by means of an imagewise heat treatment. The processing, or visible-image formation, may be performed by a sequential laminating-delaminating step of a sheet material against the image-bearing surface of a recorded film. The imaging material, as described e.g. in EP 93 201 858, generally comprises a transparent sheet bearing an imaging layer. The imaging layer is covered with a release layer and a thermosensitive adhesive layer having a second-order transition temperature ranging from 20° to 60° C.

The processing occurs by laminating a transfer sheet material to the thermosensitive adhesive layer under pressure and at increased temperature. Such transfer sheet material may be any coated or uncoated paper type, polyester or any other flat base. The visible image is produced by peeling apart again the laminate of the two above-mentioned sheet materials, i.e. the image-bearing and the transfer sheet materials. During the peeling-apart or delamination process the imagewise recorded areas of the imaging and release layers are left on the transparent base. The non-image areas, i.e. the layer areas that have not been imagewise recorded, together with the release layer remain adhered to the transfer sheet material. As a result of the peeling-apart process two complementary images are generated. i.e. one on the transparent base and the other on the transfer sheet material.

For the following reasons, it is essential to apply a sufficiently high amount of heat to the sheet materials within a relatively short period of time:

(1) achievement of the highest possible production speed;
(2) achievement of a range allowing lamination and delamination to take place at the same speed; and
(3) achievement of a speed range for obtaining optimum image quality irrespective of the materials used. This can be realised by exposing the transfer sheet material and/or film material either for a short time to a high temperature or for a prolonged time to a lower temperature. A sufficient heat supply to the thermosensitive adhesive layer is required for heating it to above its second-order transition temperature so that it softens and exhibits its adhesive behaviour.

For the same reasons, the initiation or start of delamination and the actual delamination or peeling-apart of the two sheet materials at the delamination side should occur at the highest possible speed. However, there are the following restrictions:

(1) the low end of the speed range is restricted by a specified minimum production speed and speed-dependent image quality; and
(2) the upper end of the speed range is restricted by the practicalities of accelerating from standstill or low speed to high speed.

It has been found that practical values for operating speeds are as follows:

(1) initiation speeds ranging from 1 to 20 m/min, and
(2) delamination speeds varying between 1 and 10 m/min.

Devices for realising the peeling apart of two bases laminated together have been disclosed in the Belgian Patent Application No 93 01277 filed on Nov. 19, 1993.

OBJECT OF THE INVENTION

It is an object of the present invention to provide an improved device for initiating the peeling apart of the previously described laminated sheets.

SUMMARY OF THE INVENTION

According to the present invention a device for initiating the delamination of a first and a second sheet laminated together and arranged for forming a practicable image in one of the sheets is characterised in that the sheets are laminated, together with the leading edge of the first sheet extending beyond the leading edge of the second sheet means are provided for positioning and clamping the laminate in one particular position leaving the leading edges of the laminate free, means are provided for bending off the free leading edges of the laminate on a well-specified corner, thereby causing an initiation of the delamination, means are provided for scraping the second sheet from the first sheet, and means are provided for clamping the scraped-off sheet.

According to one embodiment of the present invention, the laminate is clamped between a base element and a supporting element, with the first sheet in contact with the supporting element and the second sheet in contact with the base element, leaving the leading edges of the laminate free. A moving L-shaped separating element, which in its initial state is retracted under the free leading edges, is shifted to a second state which bends the free leading edges on a corner of the supporting element, thereby leaving the first sheet clamped between the separating element and the supporting element and releasing the leading edge of the second sheet resulting in an initiation of the delamination. When returned to its initial position the L-shaped separating element scrapes the second sheet from the first sheet and clamps the second sheet between the separating and base elements.

According to a further embodiment of the present invention, the base element consists of a drum with a specified radius on which one of the sheets is guided during further lamination.

The present invention as described herein is particularly suited to producing a visible image by means of the laminating-delaminating process as described above. It will be clear to those skilled in the art that a device in accordance with the present invention is not limited to this particular application but can also serve for producing printing plates, proofing material, etc., by delaminating a previously laminated image-receiving base.

BRIEF DESCRIPTION OF THE DRAWINGS

The present invention is described herein below and by way of illustration reference is made to the accompanying drawings of some preferred embodiments wherein:

FIG. 4a to 4e represent the various steps of a fourth embodiment of the invention.

DETAILED DESCRIPTION OF THE INVENTION

Figure 1A:
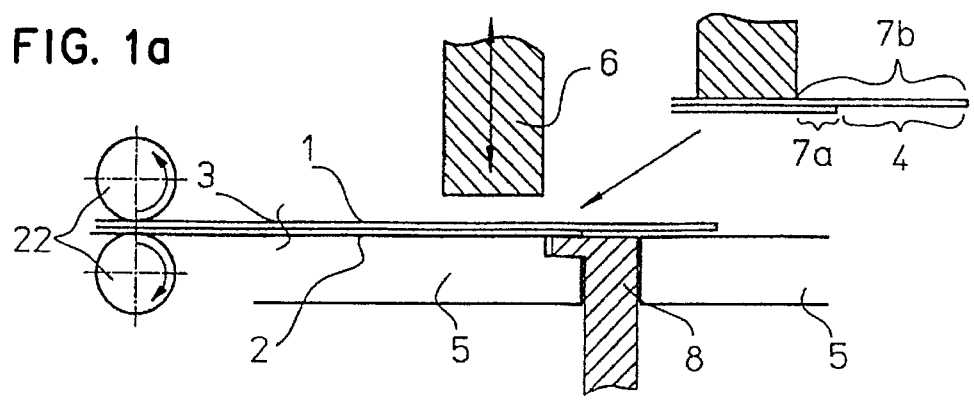
FIG. 1a to 1d represent four side-view steps in the use of a first embodiment of the present invention.
Figure 1B:
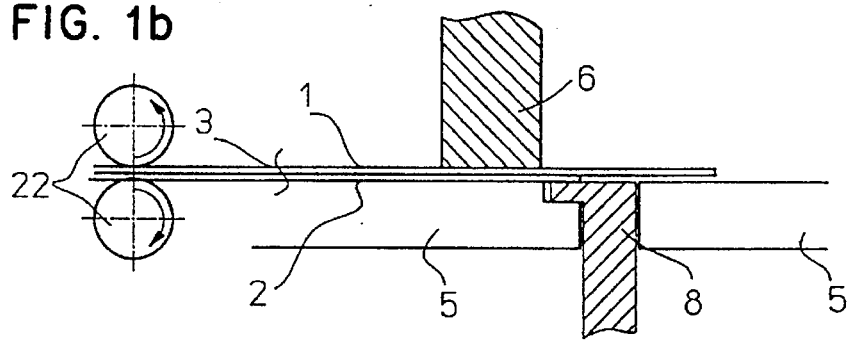

FIG. 1 is a drawing of a preferred embodiment of the present invention for initiating the peeling apart of two sheets 1 and 2 constituting together a laminate 3. The two sheet 1 and 2 have leading edges 7a and 7b, respectively, and are laminated together in such a way that leading edge 7b extends beyond leading edge 7a by an overhang area 4.

The device consists of a base element 5 onto which a supporting element 6 can be clamped, and a generally L-shaped separating element 8, slidably mounted on the base element, which in its initial state or idle state lies recessed within the base element.

The laminate is positioned and clamped shown in (FIG. 1b) between the base element 5 and the supporting element 6 in a way that a well-specified length of the free leading edges 7a and 7b are still present and that the sheet 2 is adjacent to the base element 5.

Figure 1C:
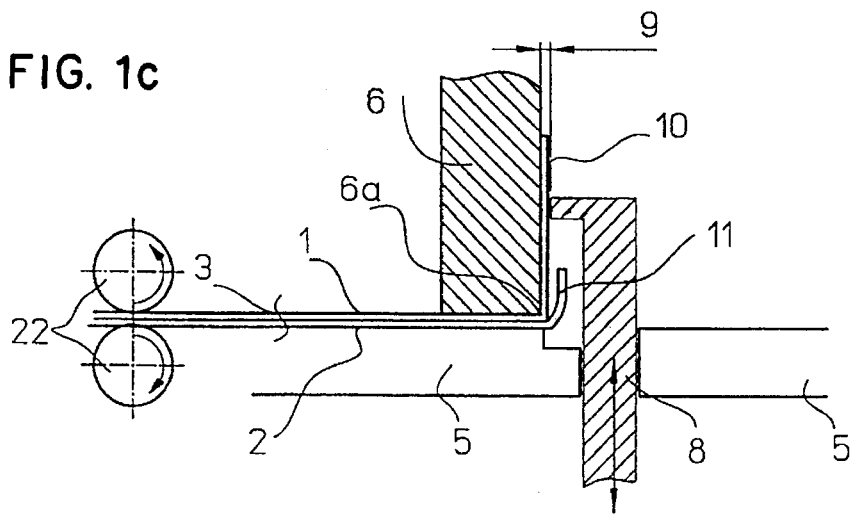
Figure 1D:
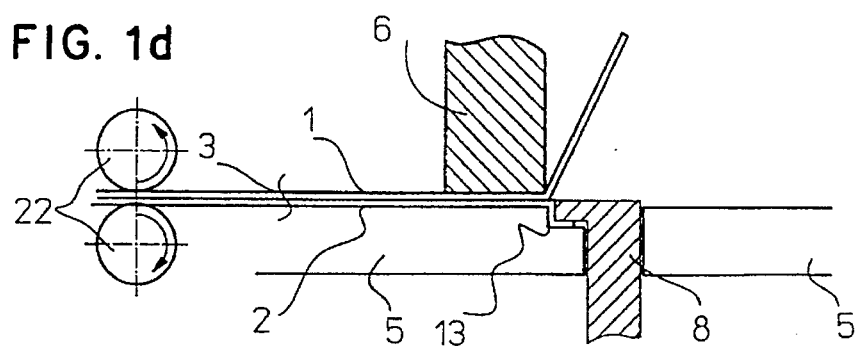

When the L-shaped separating element 8 is shifted to a second position by being pushed out of the base element 5 at a specified speed, the free leading edges 7a and 7b are bent off on a corner 6a of the supporting element 6. Due to a difference in stiffness together with a combination of tensile force, speed, and corner radius, the above-mentioned bending-off on a corner results in an outward force component that exceeds the bond strength between sheet 1 and 2. The device is designed in a way that, when the separating element is in its second position (as shown in FIG. 1c), end 10 of sheet 1 is clamped between separating element 8 and supporting element 6, whereas end 11 of sheet 2 is released into a recess formed by supporting element 6 and separating element 8. Thus, in combination with the outward force, an initiation of the delamination is produced.

Upon return of the L-shaped separating element in (FIG. 1d) to its initial or idle state, because of the L-shape of the separating element end 11 of sheet 2 is scraped off from sheet 1 and eventually becomes clamped between separating element 8 and base element 5.

Both the degree of bending-off of the free leading edges 7a and 7b when the separating element 8 is shifted to its second position, and the clamping of sheet 1 in this second position are defined by the spacing 9 between the separating element 8 and the supporting element 6 (FIG. 1c).

Figure 2:
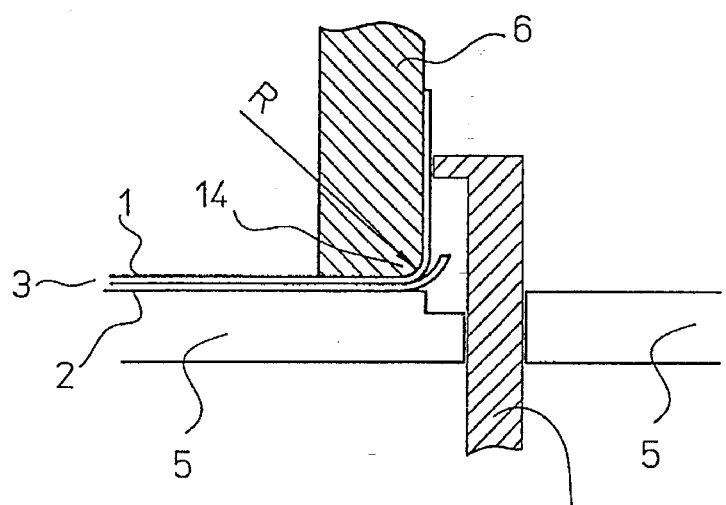
FIG. 2 represents a second embodiment of the invention.

FIG. 2 is a drawing of another embodiment of a device for initiating the peeling-apart process of a laminate 3 according to the present invention. The initiation and clamping proceeds in a similar way as in the above-described embodiment with the difference, however, that the corner of supporting element 6 on which the free leading edges of laminate 3 are bent off is rounded at a specified radius 14.

Figure 3:
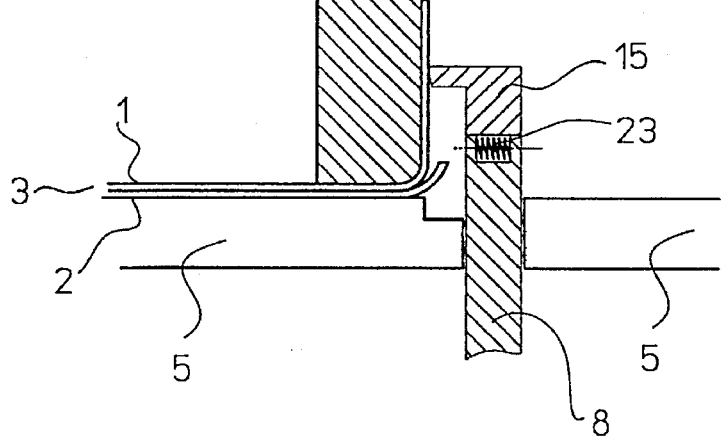
FIG. 3 represents a third embodiment of the invention.

FIG. 3 is a drawing of still another embodiment wherein nose 15 of the L-shaped element 8 is spring-mounted 23 obtaining thereby always the same pressure between free leading edges 7a, 7b and overhang area 4 on one hand, and supporting element 6 on the other hand.

FIG. 4 is a drawing of still a further embodiment of a device for initiating the peeling apart of two sheets 1 and 2 wherein the basic element 5 is integral with a roller or drum 19 the diameter of which is selected in a way that said roller can also serve as one of two rolls on which delamination is carried out (as per Belgian Patent Document 1,008,502. The device is designed in a way that the L-shaped element 8 is recessed within base roller 5. Furthermore, the device provides a roller pair 16 and a supporting element 6. The roller pair 16 is spring-mounted and presses against base roller 5. After the initiation one of the two rollers of roller pair 16 serves as delamination roller 17 which is mounted in a way that its movement is only possible along the center line that is also common to base roller 5. The other roller 18 of the roller pair is spring-mounted in a way that its circumference always follows the circumference of delamination roll 17 and that it is pressed on always in the direction of the base roller. The supporting element 6 can only move in the direction as indicated, perpendicular to the direction of movement of the roller pair 16.

Figure 4A:
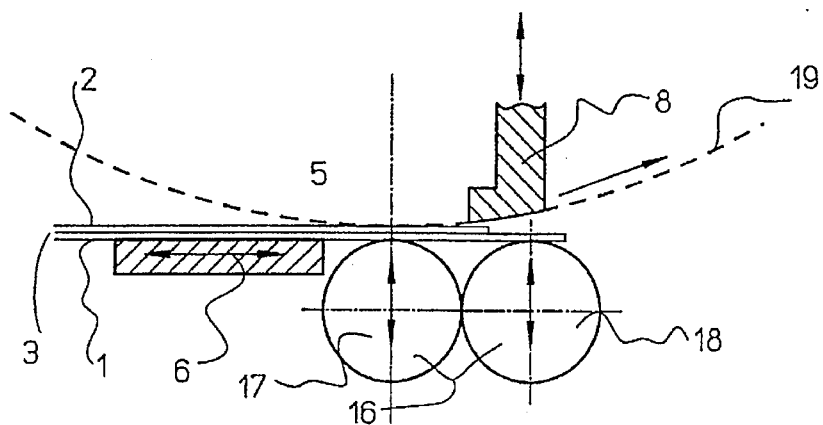

FIG. 4a represents the initial state of the device for initiating the peeling apart of two laminated bases. Laminate 3 is positioned between the periphery 19 of base roller 5 and roller pair 16.

Figure 4B:
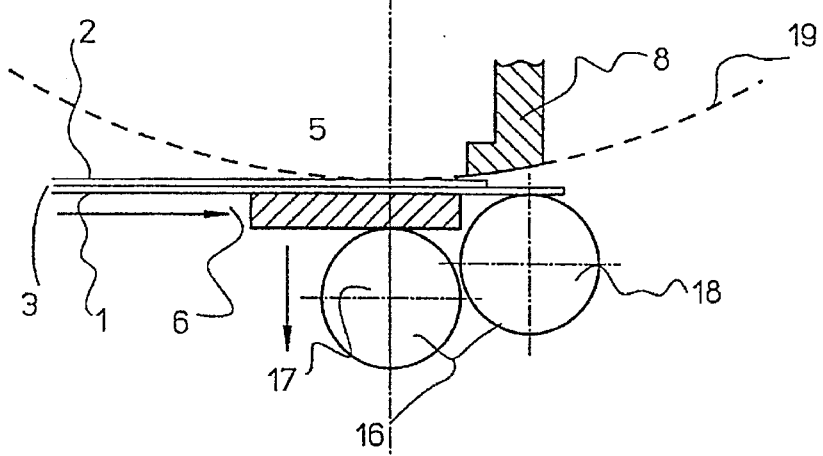

FIG. 4b represents a second state wherein, supporting element 6 is slid between roller 17 of the roller pair and base roller 5 as a result of which laminate 3 is clamped between base roller 5 and supporting element 6.

Figure 4C:
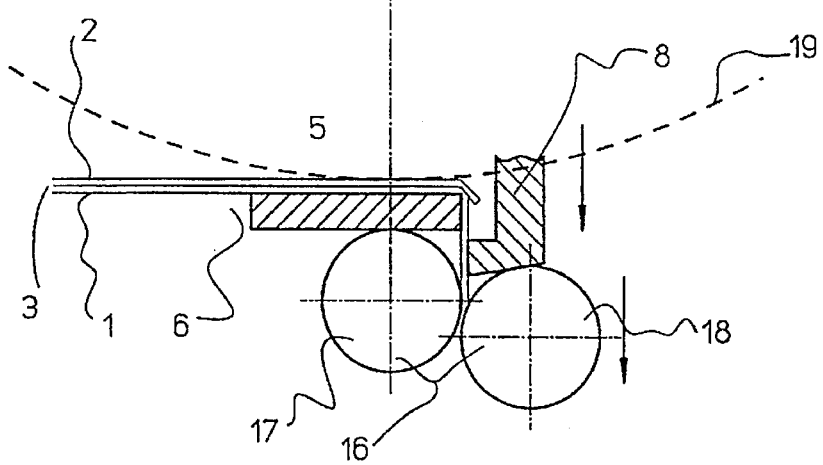

FIG. 4c represents a following state reached by the device and wherein the L-shaped separating element 8 is shifted to a second position resulting in an initiation of the delamination similar to the arrangement in FIG. 1. In this particular state the end of base sheet 1 is situated near the contact surface of both rollers of roller pair 16.

FIG. 4d represents a following state of the device. The L-shaped separating element 8 is returned to its initial state, and, in reaching this state, it has further scraped off and clamped the released end 11 of the sheet 2 from sheet 1. Due to this movement of separating element 8 and the corresponding movement of roller 18 of the roller pair sheet 1 is clamped between the contact surfaces of the roller pair 16.

FIG. 4e represents again the initial state of the device. Supporting element 6 is again returned to its idle state, wherein sheet 1 is clamped between the contact surfaces of roller pair 16, and sheet 2 is clamped between the L-shaped separating element 8 and the base roller 5. Further delamination can now occur, wherein the point of delamination is situated on the contact surface of base 19 and roller 17 of the roller pair.

Figure 5:
FIG. 5 represents alternative designs of the scraping and clamping systems of embodiments of the present invention.

FIG. 5 represents some alternatives 20 and 21 of the design of L-shaped separating element 8, wherein the design of the separating element is such that the scraping-off process of the base from the laminate is optimized.

Figure 6:
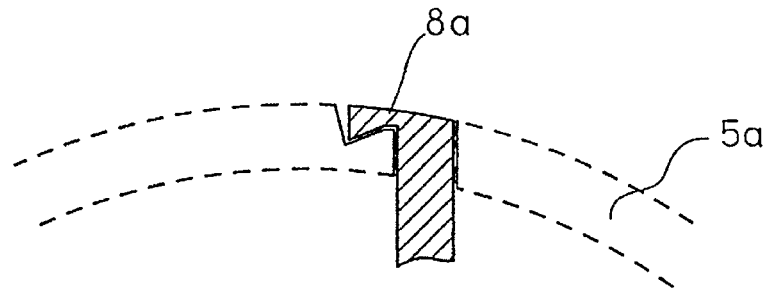
FIG. 6 represents an alternative design of scraping system and base element of an embodiment of the present invention.

FIG. 6 represents a design of the base element 5, wherein in the intitial state and in the state in which sheet 2 is clamped between L-shaped separating element 8 and base element 5, the separating element conforms to the surface of the base element. This particular design can also be applied when the base element 5 is a roller 19, as a result of which during delamination of a laminate the length of which exceeds the circumference of the base roller the supporting element forms no obstruction if a path longer than the circumference of the base roller 19 is followed.

It will be clear to those skilled in the art that the spirit and scope of the present invention is not limited to the description contained herein. Depending on the imaging material applied other designs and sizes for the various elements may be used.

We claim:

1. A delaminating device for initiating the delamination of a first sheet and a second sheet, the two sheets being laminated together such that a leading edge of the first sheet extends beyond a leading edge of the second sheet, the device comprising a base element;

a supporting element which clamps the two sheets against the base element and leaves the leading edges of the two sheets free;

an L-shaped, separating element which is slidably mounted to the base element and which is initially recessed within the base element behind the leading edges of the two sheets;

whereby the delamination of the two sheets is initiated by sliding the L-shaped element out of the base element in a direction substantially perpendicular to the initial plane of the sheets, thereby causing the leading edges of the sheets to bend around the supporting element;

whereby when the L-shaped element slides a distance out of the base element greater than the length of the leading edge of the second sheet, the leading edge of the second sheet is released and the leading edge of the first sheet is clamped between the L-shaped element and the supporting element; and whereby as the L-shaped element is retracted to its initial position, the L-shaped element causes further delamination of the two sheets and clamps the leading edge of the second sheet against the base element.

2. The delaminating device of claim 1, in which a corner of the supporting element near the leading edges of the two sheets has a specified curvature, whereby the leading edges are bent at a specified radius once the delamination is initiated.

3. The delaminating device of claim 1, in which the top of the L-shaped element is spring-mounted, such that the L-shaped element always presses the leading edges of the sheets against the supporting element with positive pressure.

4. The delaminating device of claim 1, in which the base element comprises of a drum with a specified radius on which the first sheet is guided during delamination.

5. The delaminating device of claim 2, in which the base element comprises a drum with a specified radius on which the first sheet is guided during delamination.

6. The delaminating device of claim 3, in which the base element comprises a drum with a specified radius on which the first sheet is guided during delamination.

7. The delaminating device of claim 1, further comprising a pair of rollers positioned to accept the leading edge of the first sheet as the L-shaped element bends it around the supporting element.

8. The delaminating device of claim 1, in which the L-shaped element has means for guaranteeing a reliable scraping-off of the second sheet from the first sheet when the L-shaped element is retracted to its initial position even when delamination has not been initiated by bending the two sheets around the supporting element; and in which the base element has means for enabling proper clamping of the second sheet to the base element.

9. The delaminating device of claim 4, in which a delamination roller pair is provided and the L-shaped element is recessed within the base element, so that when the sheets being delaminated are longer than the circumference of the drum, the L-shaped element does not cause an obstruction after the drum completes a full revolution.

10. The delaminating device of claim 5, in which a delamination roller pair is provided and the L-shaped element is recessed within the base element, so that when the sheets being delaminated are longer than the circumference of the drum, the L-shaped element does not cause an obstruction after the drum completes a full revolution.

11. The delaminating device of claim 6, in which a delamination roller pair is provided and the L-shaped element is recessed within the base element, so that when the sheets being delaminated are longer than the circumference of the drum, the L-shaped element does not cause an obstruction after the drum completes a full revolution.

* * * * *